(12) United States Patent
Reynolds

(10) Patent No.: US 6,771,136 B1
(45) Date of Patent: Aug. 3, 2004

(54) SYSTEM AND METHOD FOR RESTORING THE MARK AND SPACE RATIO OF A CLOCKING SIGNAL OUTPUT FROM AN OSCILLATOR

(75) Inventor: Grahame Keith Reynolds, Southampton (GB)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/013,869

(22) Filed: Dec. 10, 2001

(51) Int. Cl.$^7$ .............................. H03B 5/00; H03B 5/36; H03K 3/017; G06F 1/10
(52) U.S. Cl. ...................... 331/74; 331/75; 331/116 FE; 331/158; 331/175; 327/175; 327/295
(58) Field of Search .......................... 331/74, 75, 116 R, 331/116 FE, 117 R, 117 FE, 117 D, 158, 175; 327/165–167, 175, 176, 291, 295, 297

(56) References Cited

U.S. PATENT DOCUMENTS

| | | | |
|---|---|---|---|
| 4,479,216 A | | 10/1984 | Krambeck et al. |
| 4,527,075 A | | 7/1985 | Zbinden |
| 4,710,730 A | | 12/1987 | Doyle, III |
| 4,959,557 A | * | 9/1990 | Miller ........................ 327/175 |
| 5,204,559 A | | 4/1993 | Deyhimy et al. |
| 5,397,945 A | * | 3/1995 | Shum et al. ................... 327/77 |
| 6,084,452 A | | 7/2000 | Drost et al. |
| 6,326,827 B1 | | 12/2001 | Cretti et al. |
| 6,424,178 B1 | | 7/2002 | Harrison |
| 6,456,133 B1 | | 9/2002 | Nair et al. |
| 6,507,220 B1 | | 1/2003 | Groen et al. |
| 2002/0075039 A1 | | 6/2002 | Harrison |
| 2002/0140477 A1 | | 10/2002 | Zhou et al. |
| 2002/0140478 A1 | | 10/2002 | Fletcher et al. |
| 2002/0175739 A1 | | 11/2002 | Sidiropoulos et al. |

\* cited by examiner

*Primary Examiner*—David Mis
(74) *Attorney, Agent, or Firm*—Kevin L. Daffer; Conley Rose P.C.

(57) ABSTRACT

A circuit, system, and method are provided for regulating the mark-to-space ratio of a clocking signal. In instances where the mark-to-space ratio is targeted at 1:1 (i.e., a 50% duty cycle), then a regulated signal is formed which will produce a 50% duty cycle whenever that regulated signal is forwarded to a buffer which will produce a duty cycle other than 50% if the input signal were not regulated. The regulated signal is derived from a feedback circuit which will take into account the periodic nature of the clocking signal and whatever threshold skews might be attributable to the clock buffer. The feedback signal derives its input from a tap connected to receive the clocking signal from an output of the buffer, and the tap forwards that clocking signal to switching transistors which impute the periodic clocking frequency onto a threshold skewed output which will then form the regulated signal. Any skew resulting from the oscillator will not be passed to the node which bears the regulated signal. Instead, only the AC coupled portion of the oscillating signal will be coupled.

20 Claims, 4 Drawing Sheets

SYSTEM AND METHOD FOR RESTORING THE MARK AND SPACE RATIO OF A CLOCKING SIGNAL OUTPUT FROM AN OSCILLATOR

BACKGROUND OF THE INVENTION

1. Field of the Invention

This invention relates to a clocking circuit for synchronizing an electronic subsystem and, more particularly, to a circuit for regulating the mark/space ratio (or "duty cycle") of a clocking signal produced by an oscillator and fed to the electronic subsystem.

2. Description of the Related Art

The following descriptions and examples are not admitted to be prior art by virtue of their inclusion within this section.

Within nearly every electronic subsystem that relies upon sequential operations, it is essential to have an oscillator or waveform generator of some sort. The oscillator functions to produce a periodic waveform, and that waveform serves as a source of regularly spaced pulses, alternatively known as a "mark." Pairs of marks are separated by a "space."

There are numerous types of oscillators used to generate clocking signals for electronic subsystems. Popular oscillators include RC oscillators or LC oscillators which are fairly stable at relatively high frequencies. However, for much greater stability at even higher frequencies, crystal oscillators are used.

A crystal oscillator involves a piece of quartz that vibrates at a certain frequency. The quartz crystal can, therefore, be a central element in numerous types of oscillators, such as the Pierce oscillator or the Colpitts oscillator. As the quartz oscillates, the quartz output can be brought to a particular logic level by circuitry connected to the quartz output.

In addition to the Pierce and Colpitts oscillators, another popular oscillator is the Complimentary Metal Oxide Semiconductor ("CMOS") inverter oscillator. This oscillator generally involves an inverter placed in parallel to the quartz crystal. Depending on the RLC model of the oscillator, resistors and capacitors may also be coupled in parallel or series to the quartz and CMOS inverter.

In most instances, the output of the oscillator must drive one or more distally located electronic subsystems. If an electronic subsystem has a rather substantial clock signal load, the output of the oscillator must be buffered. A buffer can, therefore, present a constant load impedance to the oscillator, yet drive possibly numerous clocking signal loads or electronic subsystems. The buffer, thereby, serves to isolate the impedance change applicable to those subsystems from the oscillator and, thereby, stabilizes the oscillator load.

FIG. 1 illustrates an example of a CMOS crystal oscillator 10 and a buffer 12. The quartz crystal 14 may be selected to oscillate at a particular frequency, and that frequency is perpetuated and maintained at a particular logic level by inverter 16. The output from inverter 16 is a periodic waveform that has a voltage amplitude sufficient to drive buffer 12. In the example shown, the oscillator output ($V_{OSC}$) is a sine wave 18. Oscillator 10 output need not, however, be a sine wave, yet if the p- and n-channel transistors of inverter 16 are relatively weak, then a sine wave is achieved. Depending on the strength of the inverter 16, the ramp up and ramp down (leading and trailing edges) of each waveform transition can change.

Buffer 12 can be made of any circuitry which isolates the impedance of electronic subsystem 20 from oscillator 10. One example of a buffer might be an inverter or a number of inverters, depending on the needed logic value at the output of buffer 12. Preferably, buffer 12 has p- and n-channel transistors of sufficient drive strength to create a rather steep leading and trailing edges of the resulting clocking signal 22, labeled as $V_{OUT}$, produced from buffer 12.

Typically, crystal 14 is connected to input/output pads of a chip 24. Chip 24 is a single crystalline silicon substrate on which inverter 16, buffer 12, and electronic subsystem 20 can be formed. The oscillation frequency of a given crystal 14 is selected by the user and attached to the pins of chip 24 for driving a chosen frequency into buffer 12, which then fashions the clocking signal that can drive a rather large sequentially operating subsystem 20. Unfortunately, processing skews can sometimes change the voltage at which the p- and n-channel transistors of inverter 16 and buffer 12 transition from a relatively low output voltage to a relatively high output voltage. Those thresholds skews can be further compounded by temperature variations upon the chip 24. These transistor threshold skews culminate in a variation in the overall threshold (or trigger) voltage of buffers 12 and 16.

FIG. 2 illustrates the effects of threshold skew upon the resulting clock signal. For example, if the p- and n-channel transistors of buffer 12 are skewed due to transistor threshold skews, then the sinusoidal wave 18 will trigger a transition in buffer 12 at a different voltage. Alternatively, taking the trigger voltage as the point of reference, this could also be considered as an apparent DC shift in the sinusoidal waveform 18. This is shown in phantom as waveform 18a and will produce an apparent DC offset voltage, labeled as $V_{OS}$. If the thresholds of the p-channel transistor 26 and the n-channel transistor 28 of buffer 12 do not change relative to, or be adjusted to compensate for, this increased offset voltage of the sinusoid 18a, then the n-channel transistor 28 or p-channel transistor 26 may trigger much sooner or later, thereby causing an output waveform or clocking signal that has a greater mark or space timing.

In many instances, the incoming sinusoidal wave may be isolated from buffer 12 operation. In those instances, the incoming sinusoidal wave may not be accompanied by a DC offset, or a DC offset may be removed before placing the sinusoidal wave on the input of the buffer 12. In these circumstances, a DC offset must be applied which is consistent with the threshold of buffer 12. The mark/space ratio of the clocking signal 22 is then dependent primarily on any threshold voltage skews within p- and n-channel transistors 26 and 28. For example, if the n-channel transistor 28 threshold is lowered relative to the p-channel transistor 26, then n-channel transistor 28 will turn on much quicker as the input sinusoidal wave extends upward from a ground voltage towards to power supply rail. This will cause a skewing in the inverter 12 threshold and, thereby, a greater space-to-mark ratio (i.e., the low voltage value times will be greater than the high voltage value times). However, if the n-channel transistor 28 threshold increases relative to p-channel transistor 26, then the overall threshold of inverter 12 will increase. In the example shown by waveform 22 in FIG. 2, an increase in the inverter threshold $V_{TH}$, alternatively known as $V_{TRIG}$, will cause the p-channel transistor 26 to turn on much sooner than the n-channel transistor 28. This will skew the mark/space ratio so that the period of time for a mark will be greater than the period of time for a space. Thus, a duty cycle of the mark-to-space ratio will be greater than 50%. Even though the incoming sinusoidal signal ($V_{OSC}$) does not carry an offset voltage, any skewing of the buffer 12 threshold value will cause a proportional skew in the duty cycle of the clocking signal 22, shown as $V_{OUT}$.

Most electronic subsystems rely upon a duty cycle that is approximately 50%. In other words, an electronic subsystem will expect an equal mark and space time for the clocking signal being used to synchronize the various circuits of an electronic subsystem or subsystems. Many microprocessor applications, for example, require a duty cycle of 50%+/−3% symmetry. If the duty cycle skews outside the acceptable tolerance range, either due to temperature variations or processing variations, then the desired application may be severely jeopardized or, worse yet, the application may fail.

It is, therefore, desirable that an improved clocking signal circuit be employed that can dynamically regulate the mark/space ratio even though processing and temperature fluctuations can exist within the oscillator and buffer circuitry. The desired circuit contemplates an accurate clocking signal output that is symmetrical with, preferably, a duty cycle less than 50%+/−5%, more preferably 50%+/−3%, and even more preferably 50%+/−2% over variations in frequency, temperature, supply voltage, and semiconductor fabrication or processing.

SUMMARY OF THE INVENTION

The problems outlined above are in large part solved by a circuit, system, and methodology that overcomes the aforementioned deficiencies. The present circuit, system, and method can adapt to and regulate the clocking signal depending on any fluctuations within the oscillator and/or buffer. Preferably, fluctuations in temperature, supply voltage, frequency, and processing can be compensated by a feedback circuit that will mimic those skews placed on the clocking signal, and feed back a regulated signal to the buffer in a way that will effectively cancel out those skews. The regulated signal can then be used by the buffer to produce a duty cycle in the 50% range, preferably, less than +/−5%, more preferably less than +/−3%, and even more preferably less than +/−2% deviation.

According to one embodiment, a circuit is provided for regulating a clocking signal. The circuit includes a buffer coupled to produce the clocking signal. The circuit further includes a feedback circuit coupled to receive the clocking signal from the buffer which produces a regulated signal forwarded back to the buffer. This feedback circuit regulates the duty cycle of the clocking signal in proportion to any threshold skew within the buffer. Alternatively, the regulated signal regulates the duty cycle in proportion to any skew within the buffer, such as temperature skew or any form of semiconductor processing skew that will affect the performance of the buffer. Such processing skews include gate oxide breakdown, current drive, or overall resistance fluctuations in the "off" mode, "linear" mode, or "saturation" mode. Therefore, any temperature or process variations which cause the buffer to perform differently than how it was ideally designed, will be compensated for by the feedback circuit to ensure a substantially 50% duty cycle.

According to an alternative embodiment, a feedback circuit is provided. The feedback circuit includes an inverter and a pair of switching transistors coupled between the inverter and a pair of power supplies. This switching transistors can receive a clocking signal produced by a buffer. The feedback circuit also includes a biasing inverter coupled to the input of the inverter. The biasing inverter has, preferably, the same threshold voltage as the buffer for producing the regulated signal from the inverter that is proportional to and compensates for any duty cycle skew placed on the clocking signal by the buffer.

According to yet another embodiment, a method is provided. The method is one that is adapted to produce a clocking signal by making a direct current DC offset voltage proportional to a threshold voltage of one or more transistors within a buffer. The method also includes modulating the DC offset voltage with only an alternating current voltage component of an oscillator to produce a regulated signal that, when input to the buffer, produces the clocking signal having a duty cycle that is substantially 50% (i.e., 50%+/−5%, +/−3%, or +/−2%).

BRIEF DESCRIPTION OF THE DRAWINGS

Other objects and advantages of the invention will become apparent upon reading the following detailed description and upon reference to the accompanying drawings in which.

Figure 1:
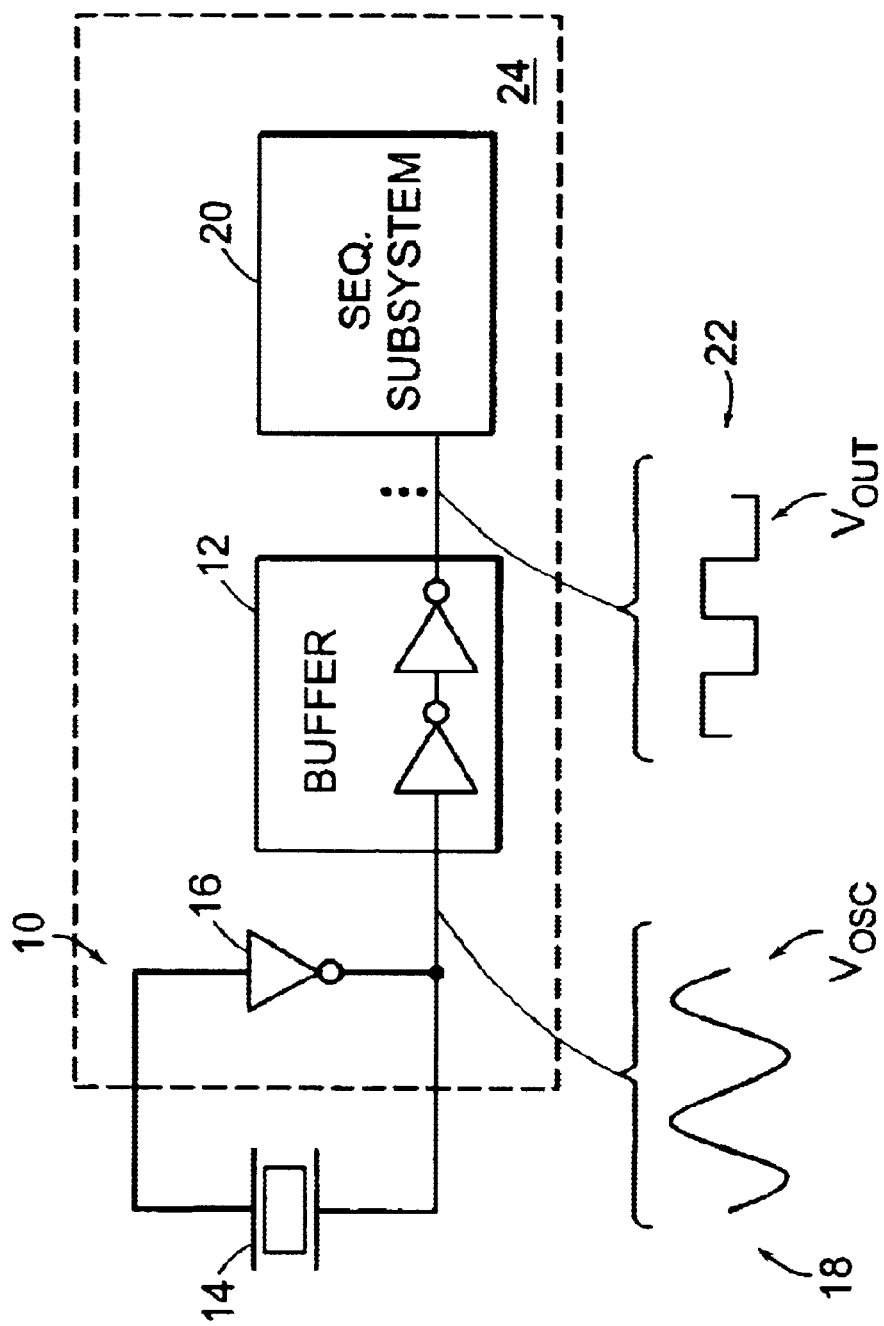
FIG. 1 is a schematic and block diagram of a circuit that produces a clocking signal forwarded to an electronic subsystem.
Figure 2:
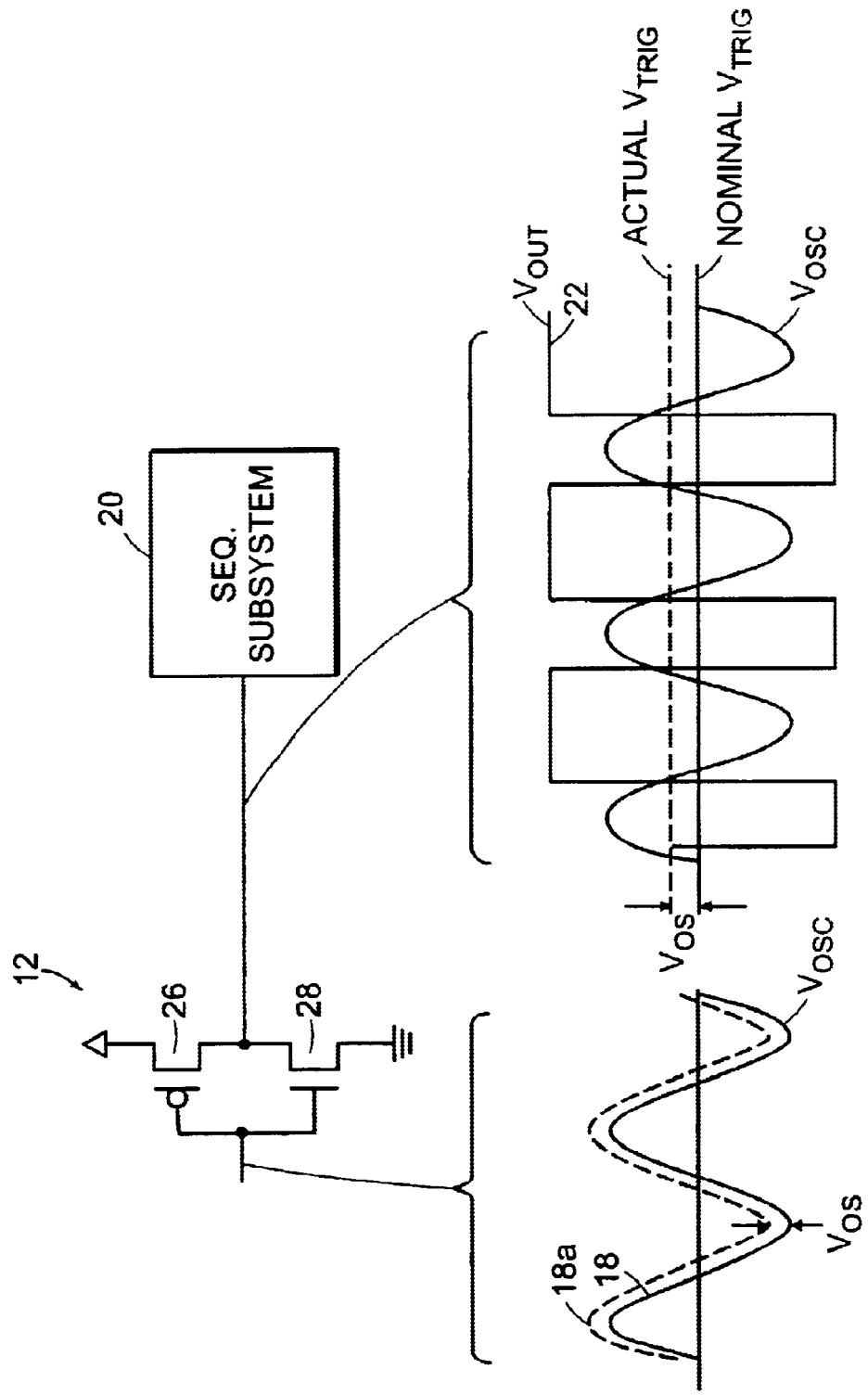
FIG. 2 is a schematic and block diagram of a buffer of FIG. 1 that produces the clocking signal duty cycle that is dependent on any DC offset forwarded to the buffer and/or any threshold skew of the buffer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
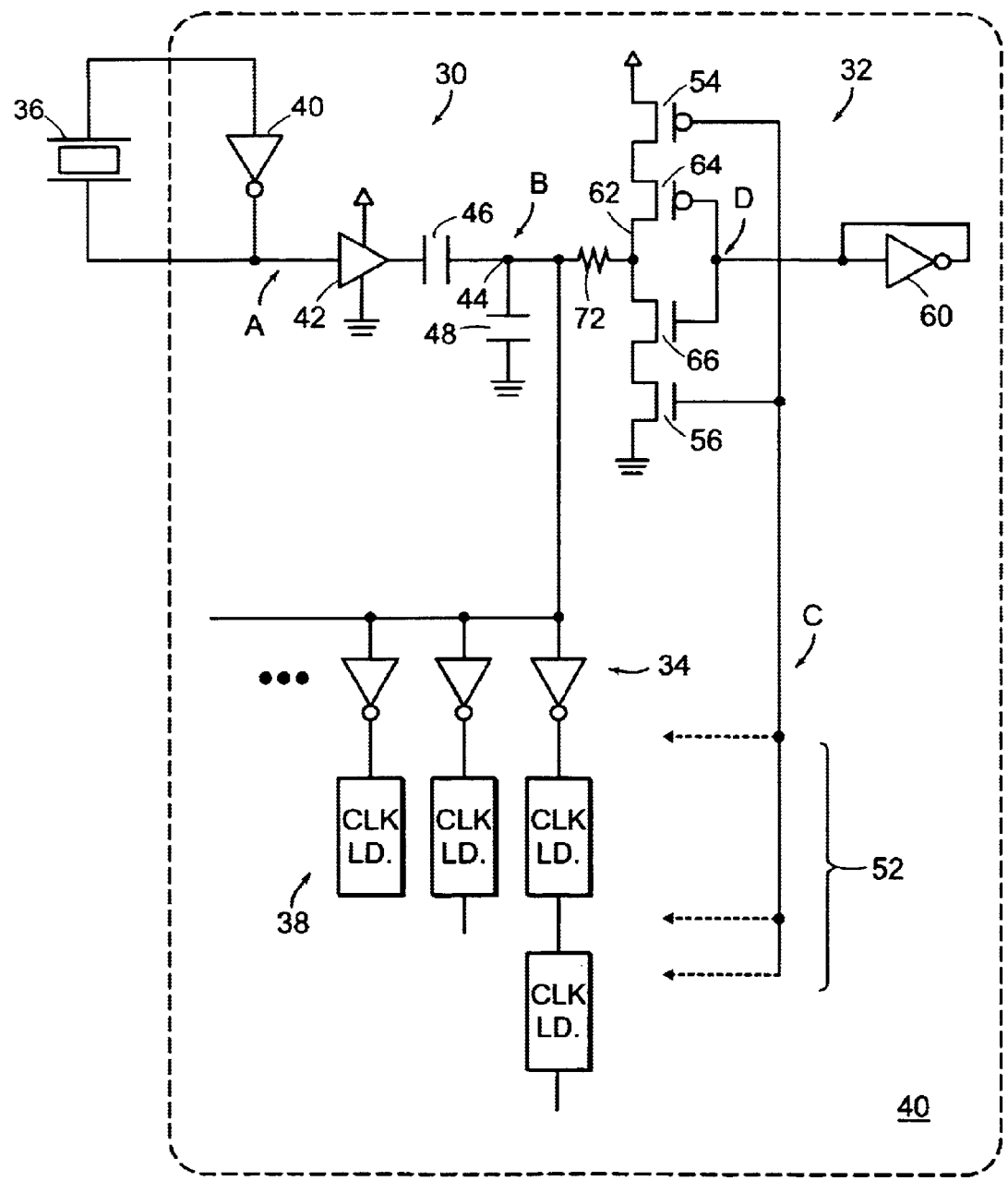
FIG. 3 is a circuit diagram of a circuit that regulates and/or restores the duty cycle of a clocking signal forwarded from an oscillator to the electronic subsystem, which accounts for any DC offset presented to the buffer or any threshold skew within the buffer.

Turning now to the drawings, FIG. 3 illustrates an oscillator 30, a feedback circuit 32, and one or more buffers 34 connected between oscillator 30 and feedback circuit 32. Except for the quartz crystal 36, all of the components of oscillator 30, feedback circuit 32, and buffers 34, as well as the subsystem or clock load circuits 38, are found on a single substrate 40 which can be, for example, single crystalline silicon. If necessary, however, the clock load subsystems 38 can be found on another substrate separate from substrate 40. Therefore, the clocking signal output from buffers 34 can be routed to subsystems on the same substrate or on another substrate, if desired. One advantage of having the various components on the same substrate is that the components all have the same threshold voltage skews, and are subjected to the same processing variations or temperature fluctuations which would change their operation consistently from one component to the next. That fact is taken advantage of and utilized as part of feedback circuit 32 to compensate for any threshold skews within the buffer 34. In other words, the effects of threshold skews of buffer 34 are input to feedback circuit 32 to ensure than whatever duty cycle variations arise from the output of buffers 34 will be compensated for and reduced in the feedback loop.

Oscillator 30 includes any oscillating circuit which can produce a periodic waveform with a form factor less than 1, labeled as waveform A. The oscillator can include, for example, a CMOS inverter 40 coupled to the quartz crystal 36. There may be other passive elements connected between quartz 36 and inverter 40, if desired. Those elements include a capacitor or resistor, or both, for example. Waveform A is forwarded into, for example, another inverter, if desired. Alternatively, the inverter can operate as an amplifier, noted as reference numeral 42. If item 42 is an inverter, then waveform A is phase shifted 180° and, thereafter, AC coupled onto an accumulation node 44 by a high-pass capacitor 46. Capacitor 46 is configured in a high-pass filter arrangement to forward only the alternating current ("AC") component of signal A onto node 44. Accumulation node 44 will, thereafter, sum the AC coupled wave from A and the feedback waveform from feedback circuit 32. Capacitor 48 is used to maintain whatever DC offset exists from the feedback circuit waveform. Yet, however, capacitor 48 will not accumulate any DC offset from waveform A since waveform A is only AC coupled onto accumulation node B. Any DC component of waveform A will be blocked by capacitor 46.

Coupled to accumulation node 44 is one or more buffers 34. Buffers 34 serve to isolate the impedance on node 44 from the rather high impedances of the electronic subsystem 38. Feedback circuit 32 is connected to the output of one of the buffers 34, possibly, at the furthest distance from that buffer. A tap 52 is used to connect feedback circuit 32 to a remote point on substrate 40 that receives the clocking signal. That remote point may be upstream or downstream of a clock load circuit (CLK. LD.). Preferably, the tap 52 is placed at the most distal location from a corresponding buffer 34 in order to measure the clocking signal in a worst-case scenario. The clocking signal received by tap 52 is shown as waveform C in FIG. 4, and the clocking signal is then forwarded to switching transistors 54 and 56. Switching transistors 54 maintain the periodic mark and space cycle of the clocking signal as conveyed to feedback circuit 32. In particular, as the clocking signal increases in magnitude, transistor 56 will turn on while transistor 54 will turn off. This causes a space to occur on the output of feedback circuit 32, rather than a mark. If the gate widths of transistors 54 and 56 are fairly small, then instead of forming a square wave at the output of feedback circuit 32, transistors 54 and 56 will apply bias to accumulation node 44. Importantly, a mark will appear as a positive going bias to the sine wave, while a space will appear as a negative going bias to the sine wave. Thus, feedback circuit 32 weakly pulls high, a positive going bias is applied to the accumulation node 44, when feedback circuit 32 weakly pulls low, a negative going bias is applied to the accumulation node 44. Feedback circuit 32, thus, alters the DC bias on the accumulation node 44 in sympathy with the clock waveform taken from the distally located clock buffer.

The DC bias on accumulation node 44 is further regulated by a biasing inverter 60. Inverter 60 is connected so that its output connects to its input, which is then connected to the input of another inverter 62 made up of transistors 64 and 66. By connecting the input to the output of biasing inverter 60, a DC voltage occurs. The DC voltage is centered as a threshold voltage of inverter 60. The DC bias present on accumulation node B is the result of switching transistors 54 and 56 being pulled in phase with the clocking signal C. Switching of those transistors will cause the output of feedback circuit 32 to maintain the periodic nature of the clocking signal C and alter the DC bias of the accumulation node B.

Figure 4:
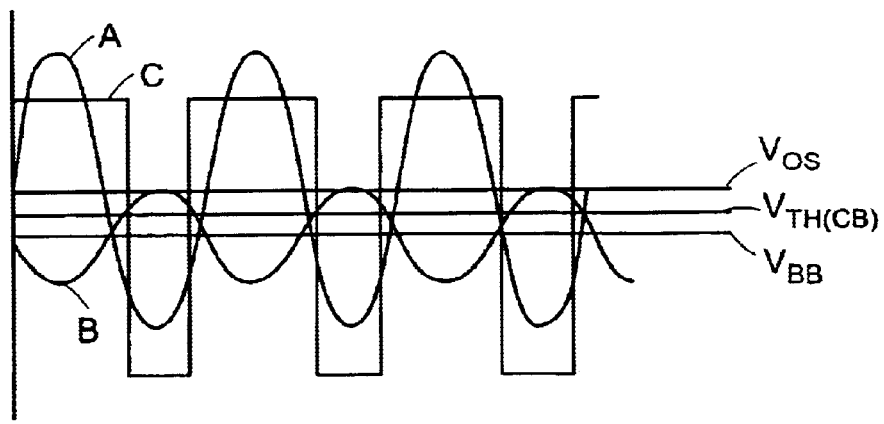
FIG. 4 is a timing diagram of exemplary signals output from the oscillator, from an AC-coupled feedback circuit, and from the buffer output before the buffer output (i.e., clocking signal) duty cycle is restored.
Figure 5:
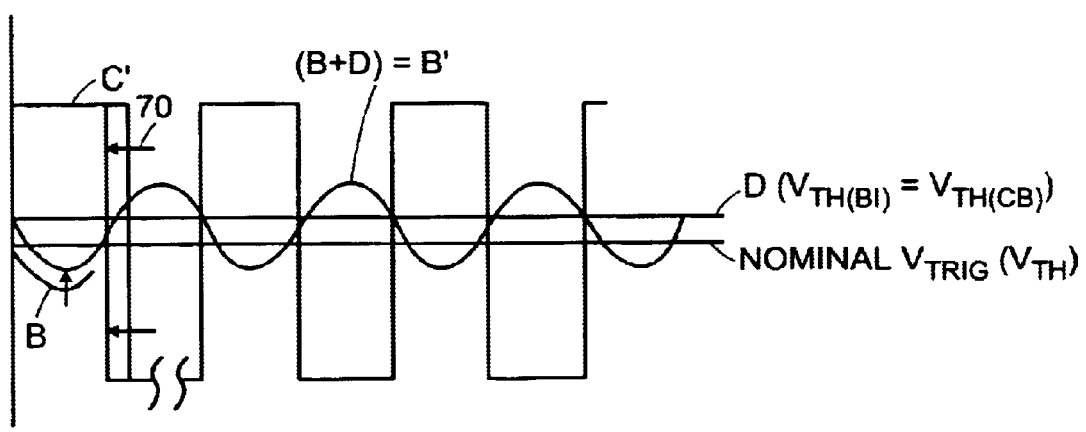
FIG. 5 is a timing diagram of exemplary signals output from a bias circuit, the effect of the bias circuit output upon the AC-coupled feedback circuit output, and the resulting restoration of the duty cycle of the clocking signal.

The operation of the circuit shown in FIG. 3 is described in reference to FIGS. 4 and 5. During initial set-up, there is no corrective feedback signal sent from feedback circuit 32 and, therefore, waveform B is simply waveform A, possibly shifted in phase, and without the DC component of waveform A. Therefore, waveform A is shown with a midline voltage $V_{OS}$ designated as an initial offset voltage. Waveform A is phase-shifted if an inverter is used as item 42 of FIG. 3 to present a waveform B on the accumulation node 44 and only the AC component of waveform A is coupled onto node 44. Thus, waveform B centers around the base band voltage or 0 volts. The purpose of the feedback circuit is to apply a DC bias to the accumulation node consistent with the threshold of the buffer.

To account for any changes in the thresholds of the transistors of clock buffer 34, the clocking signal C is taken from the clock buffer. That clocking signal waveform C is then used to switch the feedback circuit switching transistors, thereby, causing the periodic nature of the clocking signal to be placed on the output of the feedback circuit 32 as waveform B, along with the threshold of biasing inverter 60. As shown in FIG. 5, waveform B is shifted by a DC value commensurate with the threshold of the biasing inverter 60. Thus, waveform D is added to the previous waveform B to form the next waveform B or B'. Waveform B' is simply waveform B after one or more feedback operations. Thus, waveform B gets updated for each feedback cycle. Importantly, the threshold within biasing inverter 60 is the same as the threshold within the buffer 34. Preferably, buffer 34 is an inverter similar in size to the biasing inverter 60. Thus, whatever threshold skews occur within buffer 34 will be mimicked in inverter 60 since both are manufactured on the same substrate and are, thereby, subject to the same processing variations and temperature fluctuations. Waveform B can be the same voltage amplitude as waveform A depending on the gain of amplifier/inverter 42 (shown in FIG. 3). Also, depending on whether amplifier/inverter 42 is inverting or non-inverting, the phase relationship between waveforms A and B can be at 0° or 180°.

Waveform B' will, therefore, be forwarded to the clock buffer 34 and, since waveform B' is shifted by a threshold identical to the threshold of buffer 34, buffer 34 will transition in a symmetrical fashion even though buffer 34 has a threshold skew. Thus, as seen in FIG. 5, waveform B' has a midpoint voltage of waveform D commensurate with the bias inverter threshold and the clock buffer threshold. Waveform B' will trigger the clock buffer such that the clocking signal waveform C will have a mark-to-space ratio of 1 (i.e., a duty cycle of 50%). As shown in FIG. 5, the trigger voltage is the same voltage as the threshold voltage of buffer 34 (which is the same as the threshold voltage of the bias inverter 60).

Continuing to refer to FIGS. 3 and 4, waveform B forms the input to buffers 34. If the clock buffer (CB) has a threshold skew, then buffer 34 will trigger at the skewed threshold causing the mark-to-space ratio to be greater than 1 (i.e., a duty cycle greater than 50%). Thus, an increase in the threshold voltage of the clock buffer 34 will create a greater mark-to-space ratio. Conversely, a threshold of the clock buffer that is below the base band voltage will cause the mark-to-space ratio to be less than 1 (i.e., a duty cycle less that 50%).

Arrows 70 indicate that the feedback process may be iterative. Thus, depending on the size of transistors 54, 56, 64, and 66, it may take several feedback cycles before waveform B becomes the final waveform B' and, accordingly, before waveform C becomes the final waveform C' (i.e., the clocking signal waveform that has substantially a 50% duty cycle). It may be desirable that multiple feedback cycles be used in order to dampen the feedback effect. Thus, there may be many oscillation cycles which must take place before the eventual waveform C' is derived. One way to ensure this dampening effect is to implement a resistor 72 (shown in FIG. 3) in the feedback loop. Another way may be to introduce a capacitor, possibly along with resistor 72. The capacitor (not shown) along with resistor 72 provides an RC time constant that will be needed to provide proper dampening. A capacitor need not, however, be designed since most conductive lines have a parasitic capacitive element associated with that conductor and, therefore, forming a resistor may be all that is needed to introduce the proper amount of dampening.

It will be appreciated to those skilled in the art having the benefit of this disclosure that the embodiments described are believed applicable to any circuit which drives a clocking signal onto an electronic subsystem, and which can be used to compensate for processing variations, temperature fluctuations, and other threshold skewing or offset effects within the driver circuit that would yield an undesirable duty cycle. Preferably, the driver circuit is one which can regulate the duty cycle to a target duty cycle that is at or near 50%. If, however, another duty cycle other than 50% is targeted, the biasing inverter can be modified in size, or multiple inverters connected in series, to present a threshold that is different from the buffer threshold and, thereby, targeted to a particular duty cycle regardless of whatever the buffer threshold might be. In a preferred embodiment, however, the targeted duty cycle is 50% with matching thresholds between the biasing inverter and the buffer. The specification and drawings are to be regarded in an illustrative rather than a restrictive sense as to possibly numerous such devices and alternative configurations which fall within the spirit and scope of the present invention.

What is claimed is:

1. A circuit for regulating a clocking signal, comprising:
    a buffer coupled to produce the clocking signal; and
    a feedback circuit coupled to receive the clocking signal from the buffer which produces a regulated signal forwarded back to the buffer, wherein the feedback circuit regulates the duty cycle of the clocking signal in proportion to any threshold skew within the buffer.

2. The circuit as recited in claim 1, wherein the duty cycle of the clocking signal produced as a result of the buffer receiving the regulated signal is substantially 50 percent.

3. The circuit as recited in claim 1, wherein the regulated signal has a direct current (DC) offset voltage proportional to the duty cycle of the clocking signal.

4. The circuit as recited in claim 1, wherein the regulated signal has a direct current (DC) offset voltage proportional to the threshold skew within the buffer.

5. The circuit as recited in claim 1, wherein one or more transistors within the buffer turn on whenever the regulated signal transitions to a voltage value which exceeds a threshold of said transistors proportional to the threshold skew.

6. The circuit as recited in claim 4, further comprising an oscillator coupled between the buffer and the feedback circuit, wherein the oscillator is adapted to produce an oscillating signal that is modulated by the DC offset voltage of the regulated signal before forwarding a modulated, oscillating signal to the buffer.

7. The circuit as recited in claim 6, wherein the oscillating signal has a form factor less than one.

8. The circuit as recited in claim 7, wherein a relatively high voltage value and a relatively low voltage value of the oscillating signal and the regulated signal are substantially equal in time.

9. A feedback circuit, comprising:
    an inverter;
    a pair of switching transistors coupled between the inverter and a pair of power supplies, wherein the switching transistors are adapted to receive a clocking signal produced by a buffer; and
    a biasing inverter coupled to an input of the inverter, wherein the biasing inverter has the same threshold voltage as the buffer for producing a regulated signal from the inverter that is proportional to and compensates for any duty cycle skew placed on the clocking signal by the buffer.

10. The feedback circuit as recited in claim 9, wherein the inverter, the pair of switching transistors, the buffer and the biasing inverter are formed upon a single monolithic substrate.

11. The feedback circuit as recited in claim 9, wherein the regulated signal has a direct current (DC) offset voltage proportional to the duty cycle of the clocking signal.

12. The feedback circuit as recited in claim 9, wherein the regulated signal has a direct current (DC) offset voltage proportional to an amount of time the clocking signal is at a relatively high voltage value compared to an amount of time the clocking signal is at a relatively low voltage value.

13. The feedback circuit as recited in claim 9, wherein the regulated signal has a mid-level voltage equal to a threshold voltage of the biasing inverter.

14. The feedback circuit as recited in claim 9, wherein the regulated signal has a mid-level voltage equal to a threshold voltage of the buffer.

15. The feedback circuit as recited in claim 9, wherein the duty cycle skew placed on the clocking signal by the buffer is a result of temperature or voltage skew within the buffer.

16. A method for producing a clocking signal, comprising:
    making a direct current (DC) offset voltage proportional to a threshold voltage of one or more transistors within a buffer;
    modulating the DC offset voltage with only an alternating current (AC) voltage component of an oscillator to produce a regulated signal that, when input to the buffer, produces the clocking signal having a duty cycle that is substantially 50 percent.

17. The method as recited in claim 16, wherein said modulating comprises forwarding the AC voltage onto a summing node that also receives the DC offset voltage not from the oscillator but from a feedback circuit coupled between the buffer and the summing node.

18. The method as recited in claim 16, wherein said making comprises biasing an inverter within a feedback circuit coupled between the buffer and the oscillator, wherein the inverter is biased with a threshold voltage that is proportional to the threshold voltage of the one or more transistors within the buffer.

19. The method as recited in claim 16, wherein said making comprises extracting the clocking signal indirectly from an output of the buffer and coupling the clocking signal onto a pair of switching transistors within a feedback circuit coupled between the buffer and the oscillator.

20. The method as recited in claim 19, wherein said extracting comprises coupling the clocking signal at a point either before or after forwarding the clocking signal upon a subsystem clocked by the clocking signal.

* * * * *